(12) United States Patent
Sandberg

(10) Patent No.: US 11,456,748 B2
(45) Date of Patent: Sep. 27, 2022

(54) STATE ESTIMATION FOR TIME SYNCHRONIZATION

(71) Applicant: CommScope Technologies LLC, Hickory, NC (US)

(72) Inventor: Stuart D. Sandberg, Acton, MA (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 17/391,544

(22) Filed: Aug. 2, 2021

(65) Prior Publication Data
US 2022/0038103 A1   Feb. 3, 2022

Related U.S. Application Data

(60) Provisional application No. 63/060,530, filed on Aug. 3, 2020.

(51) Int. Cl.
| | |
|---|---|
| *H03L 7/06* | (2006.01) |
| *H03M 1/06* | (2006.01) |
| *H04J 3/06* | (2006.01) |
| *H04L 7/033* | (2006.01) |

(52) U.S. Cl.
CPC ............ *H03L 7/06* (2013.01); *H03M 1/0624* (2013.01); *H04J 3/0682* (2013.01); *H04L 7/0334* (2013.01)

(58) Field of Classification Search
CPC ..... H03L 7/06; H03L 7/07; H03L 7/16; H03L 7/24; H04L 7/04; H04L 7/041; H03M 1/0624; H03M 1/0626
USPC ....................................................... 375/376
See application file for complete search history.

(56) References Cited

U.S. PATENT DOCUMENTS

| | | | | |
|---|---|---|---|---|
| 4,005,266 A | * | 1/1977 | Lehr ...................... | H03L 7/06 375/354 |
| 7,372,875 B2 | * | 5/2008 | Hadzic .................. | H03L 7/085 375/373 |
| 7,613,268 B2 | | 11/2009 | Aweya et al. | |
| 7,643,595 B2 | * | 1/2010 | Aweya ................. | H03L 7/1075 375/376 |

(Continued)

FOREIGN PATENT DOCUMENTS

| | | |
|---|---|---|
| EP | 3269118 A2 | 1/2018 |
| EP | 3053287 B1 | 6/2020 |

(Continued)

OTHER PUBLICATIONS

Eidson, "IEEE-1588 Standard Version 2—A Tutorial", Agilent Technologies, Oct. 2, 2006, pp. 1 through 21, Agilent Technologies, Inc.

(Continued)

*Primary Examiner* — Hai L Nguyen
(74) *Attorney, Agent, or Firm* — Fogg & Powers LLC

(57) ABSTRACT

In one embodiment, a local clock is synchronized to a master clock using a Kalman filter to determine state variables using a state transition matrix that includes at least one coefficient that is associated with a digital-to-analog converter (DAC), where the state variables include a unit step variable indicative of a unit step for the system. The local clock is controlled based on the state variables determined using the Kalman filter. The unit step is indicative of an amount by which the frequency of the local clock signal changes in response to a change in the digital input of the DAC.

23 Claims, 3 Drawing Sheets

(56) References Cited

U.S. PATENT DOCUMENTS

| | | |
|---|---|---|
| 9,380,466 B2 | 6/2016 | Eyuboglu et al. |
| 9,414,399 B2 | 8/2016 | Eyuboglu et al. |
| 9,936,470 B2 | 4/2018 | Eyuboglu et al. |
| 9,998,310 B2 | 6/2018 | Barbieri et al. |
| 10,057,916 B2 | 8/2018 | Barabell et al. |
| 10,097,391 B2 | 10/2018 | Fertonani et al. |
| 10,355,895 B2 | 7/2019 | Barbieri et al. |
| 2014/0119391 A1 | 5/2014 | Yamamoto |
| 2014/0192797 A1 | 7/2014 | Licardie et al. |
| 2016/0119070 A1 | 4/2016 | Wang |
| 2017/0373890 A1 | 12/2017 | Fertonani et al. |
| 2018/0287696 A1 | 10/2018 | Barbieri et al. |
| 2019/0007246 A1 | 1/2019 | Fertonani et al. |
| 2019/0116568 A1 | 4/2019 | Fertonani et al. |
| 2019/0208575 A1 | 7/2019 | Barbieri et al. |

FOREIGN PATENT DOCUMENTS

| | | |
|---|---|---|
| WO | 2016145371 A2 | 9/2016 |
| WO | 2017070635 A1 | 4/2017 |
| WO | 2018017468 A1 | 1/2018 |

OTHER PUBLICATIONS

Garner, "IEEE 1588 Version 2", Sep. 24, 2008, pp. 1 through 89, ISPCS Ann Arbor'08.

Mills et al., "Network Time Protocol Version 4: Protocol and Algorithms Specification", Internet Engineering Task Force (IETF), Request for Comments: 5905, Jun. 2010, pp. 1 through 110, Standards Track.

Mills, "Network Time Protocol (NTP)", Network Working Group, Request for Comments: 958, Sep. 1985, pp. 1 through 14, M/A-COM Linkabit.

Mills, "Network Time Protocol (Version 1) Specification and Implementation", Network Working Group, Request for Comments: 1059, Jul. 1988, pp. 1 through 58, University of Delaware.

Mills, "Network Time Protocol (Version 2) Specification and Implementation", Network Working Group, Request for Comments: 1119, Sep. 1989, pp. 1 through 64, University of Delaware.

Mills, "Network Time Protocol (Version 3) Specification, Implementation and Analysis", Network Working Group, Request for Comments: 1305, Mar. 1992, pp. 1 through 7, University of Delware.

International Searching Authority, "International Search Report and Written Opinion from PCT Application No. PCT/US2021/044152 dated Nov. 24, 2021", from Foreign Counterpart to U.S. Appl. No. 17/391,544, pp. 1 through 10, Published: KR.

\* cited by examiner

STATE ESTIMATION FOR TIME SYNCHRONIZATION

CROSS-REFERENCE TO RELATED APPLICATIONS

This application claims the benefit of U.S. Provisional Patent Application Ser. No. 63/060,530, filed on Aug. 3, 2020, entitled "STATE ESTIMATION FOR TIME SYNCHRONIZATION", the entirety of which is incorporated herein by reference.

BACKGROUND

In systems requiring time synchronization, a Kalman filter is often used to track and/or estimate a synchronization state vector $x_n$, where n represents the sample time index, and $x_n$ minimally has two elements: the phase error $\theta_{e,n}$ and frequency error $f_{e,n}$ at the nth sample. That is:

$$x_n = \begin{bmatrix} \theta_{e,n} \\ f_{e,n} \end{bmatrix}$$

In the following discussion, T represents the time between samples. In the Kalman model, state evolves over time as:

$$x_n = F_n x_{n-1} + B_n u_n + w_n$$

where:

$$F_n = \begin{bmatrix} 1 & T \\ 0 & 1 \end{bmatrix}$$

is the state transition matrix, $w_n$ is the process noise, and $u_n$ is the control input, which impacts the state according to the control gain matrix $B_n$. Noisy observations of at least part of the state sequence are used together with a Kalman filter to arrive at estimates for $x_n$. The estimates for $x_n$ can then be used for the subsequent phases of the particular Kalman filtering algorithm used. The sequence of estimates for $x_n$ can also be used to determine a sequence of control inputs $u_n$ for maintaining the phase error $\theta_{e,n}$ and frequency error $f_{e,n}$ near zero.

Synchronization systems often utilize a digital-to-analog converter (DAC) to control the frequency for a voltage-controlled crystal oscillator (VCXO). The digital input to the DAC at time n is represented by $d_n$. A unit step in DAC value nominally results in an increase by $k_v$ in oscillator frequency, where the value for $k_v$ is derived from the manufacturer specification sheets for the DAC and VCXO. So traditionally, in the above Kalman model the control $u_n = (d_n - d_{n-1})$, the change in DAC setting at time n, and where:

$$B_n = \begin{bmatrix} 0 \\ k_v \end{bmatrix}$$

reflecting the impact of the change in DAC on $f_{e,n}$.

In practice, however, the value for $k_v$ varies part to part and is not known precisely. Furthermore, while the traditional formulation above implies a linear relationship between $f_{e,n}$ and dn, the relationship is not generally linear in practice as $k_v$ depends to some extent on the operating point $d_n$. While a constant model for $k_v$ according to manufacturer specification sheets may be adequate for some applications, for others requiring precise synchronization, the variability of $k_v$ leads to unsatisfactory state estimate accuracy using the above formulation.

SUMMARY

One embodiment is directed to a system comprising a local clock configured to output a local clock signal as a function of an analog control input. The local clock signal has a frequency. The system further comprises a digital-to-analog converter (DAC) configured to output an analog output signal as a function of a digital input. The analog control input used by the local clock is a function of the analog output signal output by the DAC. The system has a unit step that is indicative of an amount by which the frequency of the local clock signal changes in response to a change in the digital input of the DAC. The system is configured to synchronize the local clock to a master clock using a Kalman filter to determine state variables using a state transition matrix that includes at least one coefficient that is associated with the DAC. The state variables include a unit step variable indicative of the unit step. The system is used to control the local clock based on the state variables determined using the Kalman filter.

Another embodiment is directed to a method of synchronizing a local lock to a master clock. The method comprises outputting, by the local clock, a local clock signal as a function of an analog control input. The local clock signal has a frequency. The method further comprises outputting, by a digital-to-analog converter (DAC), an analog output signal as a function of a digital input. The analog control input used by the local clock is a function of the analog output signal output by the DAC. A unit step is indicative of an amount by which the frequency of the local clock signal changes in response to a change in the digital input of the DAC. The method further comprises using a Kalman filter to determine state variables using a state transition matrix that includes at least one coefficient that is associated with the DAC. The state variables include a unit step variable indicative of the unit step. The method further comprises controlling the local clock based on the state variables determined using the Kalman filter.

Other embodiments are disclosed.

The details of various embodiments are set forth in the accompanying drawings and the description below. Other features and advantages will become apparent from the description, the drawings, and the claims.

DRAWINGS

FIG. 1 is a block diagram illustrating one exemplary embodiment of a system in which the state estimation improvements for time synchronization can be used.

FIG. 2 comprises a high-level flowchart illustrating one exemplary embodiment of a method of synchronizing a local lock to a master clock.

Like reference numbers and designations in the various drawings indicate like elements.

DETAILED DESCRIPTION

Figure 1:
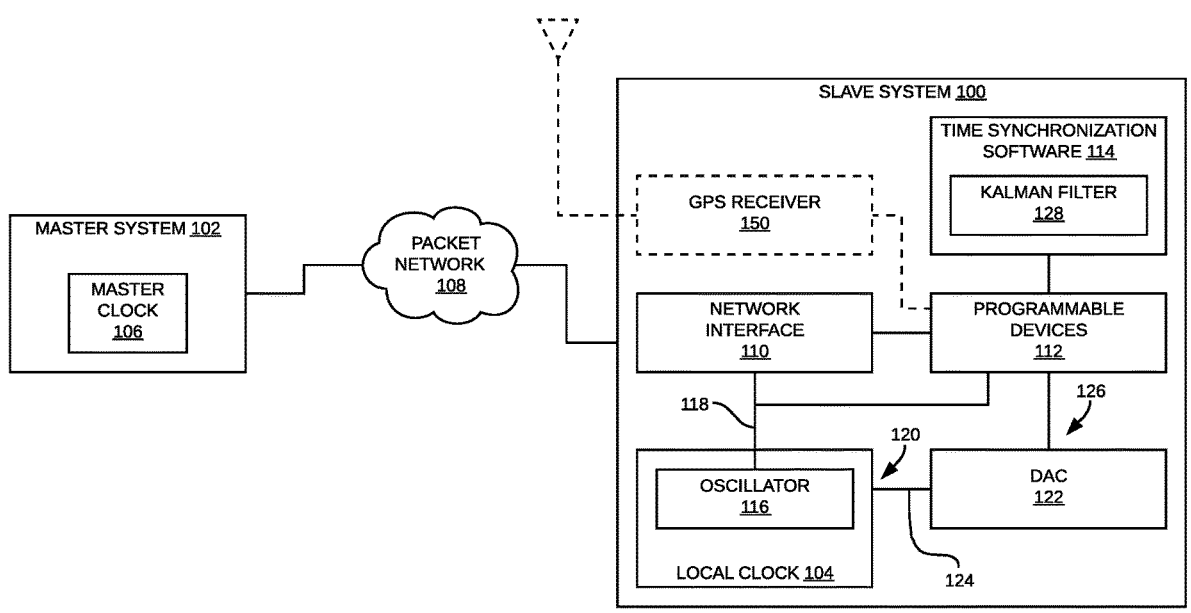

FIG. 1 is a block diagram illustrating one exemplary embodiment of a system 100 in which the state estimation improvements for time synchronization can be used. The system 100 is configured to be synchronized with another system 102. In the following description, system 100 is also referred to as the "slave system" 100 and system 102 is referred to as the "master system" 102. More specifically, a local clock 104 of the slave system 100 is configured to be synchronized with a clock 106 associated with the master system 102. It is to be understood, however, that the state estimation improvements for time synchronization described here can be used in other embodiments (for example, in embodiments where the system 100 is synchronized using the Global Positioning System (GPS), where the master clock 106 to which the local clock 104 is synchronized comprises a GPS clock).

In the example embodiment shown in FIG. 1, the slave system 100 and master system 102 are configured to use a packet-network based synchronization protocol such as the Network Time Protocol (NTP) or the Precision Time Protocol (PTP) (also referred to as the "IEEE 1588 protocol") in which timing messages are exchanged over a packet network 108. The slave system 102 includes a network interface 110 to communicatively couple the slave system 100 to the packet network 108. In the particular embodiment shown in FIG. 1, the packet network 108 comprises an Ethernet network (and is also referred to here as the "Ethernet network" 108). Likewise, in this embodiment, the network interface 110 comprises an Ethernet network interface (and is also referred to here as the "Ethernet network interface" 110).

The slave system 100 and master system 102, and any of the specific features described here as being implemented thereby, can be implemented in hardware, software, or combinations of hardware and software, and the various implementations (whether hardware, software, or combinations of hardware and software) can also be referred to generally as "circuitry" or a "circuit" or "circuits" configured to implement at least some of the associated functionality. When implemented in software, such software can be implemented in software or firmware executing on one or more suitable programmable processors or configuring a programmable device (for example, processors or devices included in or used to implement special-purpose hardware, general-purpose hardware, and/or a virtual platform). Such hardware or software (or portions thereof) can be implemented in other ways (for example, in an application specific integrated circuit (ASIC), etc.). The slave system 100 and master system 102, and any of the specific features described here as being implemented thereby, can be implemented in other ways.

In the embodiment shown in FIG. 1, the slave system 100 comprises one or more programmable devices 112 configured to execute time synchronization software 114 that is configured to synchronize the local clock 104 of the slave system 100 to the master clock 106 associated with the master system 102 using the packet-network based synchronization protocol.

The time synchronization software 114 is configured to exchange timing messages with the master system 102 over the packet network 108 and determine timestamps associated with the sending and receiving of the timing messages. The time synchronization software 114 is further configured to use the timestamps to determine frequency, phase, and time errors between the local clock 104 of the slave system 100 and the master clock 106 of the master system 102 in accordance with the packet-network based synchronization protocol.

In the embodiment shown in FIG. 1, the local clock 104 is implemented using an oscillator 116 that is configured to output a local clock signal 118 as a function of an analog control input 120. The local clock signal 118 has a frequency and a phase. The oscillator 116 can be implemented, for example, using a voltage-controlled crystal oscillator (VCXO).

The slave system 100 further comprises a digital-to-analog converter (DAC) 122 that is configured to output an analog output signal 124 as a function of a digital input 126. The analog control input 120 used by the oscillator 116 is a function of the analog output signal 124 output by the DAC 122. In the particular embodiment shown in FIG. 1, the analog output signal 124 output by the DAC 122 is provided directly to the control input of the oscillator 116 as the analog control input 120, though it is to be understood that the analog output signal 124 output by the DAC 122 can provided via intermediary circuitry (for example, circuitry configured to shift the level of the analog output signal 124 to one appropriate for the input of the oscillator 116). A unit step $k_v$ is a composite gain that indicates the amount by which the frequency of the clock signal 118 output by the oscillator 116 changes for a one-unit change in the digital value input to the DAC 122 via the digital input 126. The unit step $k_v$ can be written as the product of the "gain" of the DAC 122 and the "gain" of the oscillator 116. The "gain" of the DAC 112 indicates the amount by which the analog level of the analog output signal 124 of the DAC 122 changes for a one-unit change in the digital value input to the DAC 122. The "gain" of the oscillator 116 indicates the amount by which the frequency of the clock signal 118 output by the oscillator 116 changes in response to a change in the analog level of the analog output signal 124 of the DAC 122 (which is supplied as the analog control input 120 for the oscillator 116).

The slave system 100 is configured to use a Kalman filter 128 to synchronize the local clock 104 (more specifically, the oscillator 116) to the master clock 106. In the exemplary embodiment shown in FIG. 1, the Kalman filter 128 is implemented as a part of the time synchronization software 114.

Figure 2:
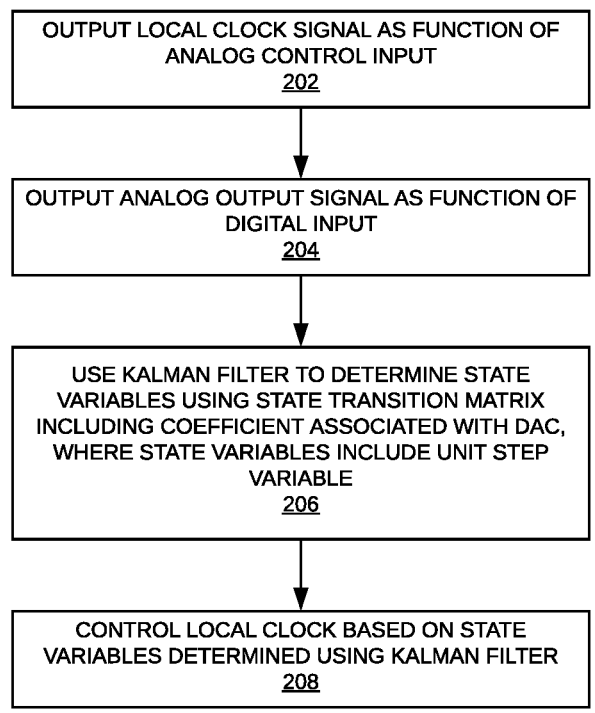

One example of how the slave system 100 uses the Kalman filter 128 to synchronize the local clock 104 to the master clock 106 is shown in FIG. 2.

FIG. 2 comprises a high-level flowchart illustrating one exemplary embodiment of a method 200 of synchronizing a local lock to a master clock. The embodiment of method 200 shown in FIG. 2 is described here as being implemented by the local system 100 described above in connection with FIG. 1, though it is to be understood that other embodiments can be implemented in other ways.

The blocks of the flow diagram shown in FIG. 2 have been arranged in a generally sequential manner for ease of explanation; however, it is to be understood that this arrangement is merely exemplary, and it should be recognized that the processing associated with method 200 (and the blocks shown in FIG. 2) can occur in a different order (for example, where at least some of the processing associated with the blocks is performed in parallel and/or in an event-driven manner). Also, most standard exception handling is not described for ease of explanation; however, it is to be understood that method 200 can and typically would include such exception handling.

Method 200 comprises outputting, by the local clock 104, a local clock signal 118 as a function of an analog control input 120 (block 202) and outputting, by the DAC 122, the analog output signal 124 as a function of a digital input 126

(block 204). As noted above the analog control input 120 used by the local clock 104 is a function of the analog output signal 124 output by the DAC 122.

Method 200 further comprises using the Kalman filter 128 to determine state variables using a state transition matrix that includes at least one coefficient associated with the DAC 122, where the state variables include a unit step variable indicative of the unit step $k_v$ for the system 100 (block 206). Method 200 further comprises controlling the local clock based on the state variables determined using the Kalman filter 128 (block 208).

In order to address the variability of the unit step $k_v$ for different values of the digital input 126 of the DAC 122, the state variables estimated using the Kalman filter 128 include an estimated unit step variable indicative of the unit step $k_v$ for the DAC 122 as well as, in this example, an estimated frequency variable indicative of the frequency of the local clock signal 118 output by the oscillator 116 and an estimated phase variable indicative of the phase of the local clock signal 118 output by the oscillator 116.

In the following discussion, T represents the time between samples. In one implementation, the Kalman filter 128 is implemented using a Kalman model that includes the following:

$$x_n = F_n x_{n-1} + w_n$$

where $x_n$ comprises the state variables for sample n and, in this example, is represented by:

$$x_n = \begin{bmatrix} \theta_{e,n} \\ f_{e,n} \\ k_{v,n} \end{bmatrix}$$

The estimated state variables $x_n$ for sample n comprise, in this example, an estimated phase error $\theta_{e,n}$ indicative of the difference between the phase of the local clock signal 118 output by the oscillator 116 and the phase of the master clock 116 for sample n, an estimated frequency error $f_{e,n}$ indicative of the difference between the frequency of the local clock signal 118 output by the oscillator 116 and the frequency of the master clock 116 for sample n, and an estimated unit step $k_{v,n}$ for the DAC 122 for sample n. It is to be understood, however, that other state variables $x_n$ can be estimated using the Kalman filter 128. For example, the state variables $x_n$ can further include higher-order derivatives of the phase of the local clock signal 118 (the frequency of the local clock signal 118 being the first derivative of the phase of the local clock signal 118).

In this implementation, the state transition matrix $F_n$ is expanded to include at least one coefficient associated with the DAC 122. Specifically, in the example described here, the state transition matrix $F_n$ is as follows:

$$F_n = \begin{bmatrix} 1 & T & 0 \\ 0 & 1 & (d_n - d_{n-1}) \\ 0 & 0 & 1 \end{bmatrix}$$

where $d_n$ represents the value of the digital input 126 for the DAC 122 for sample n and $d_{n-1}$ represents the value of the digital input 126 for the DAC 122 for sample n−1. The control gain matrix $B_n$ (which included values for the unit step $k_{v,n}$ for the DAC 122) and control input $u_n$ (which included values for the digital input 126 of the DAC 122) are eliminated from the Kalman model. It is to be understood, however, that different state transition matrices $F_n$ that include at least one coefficient associated with the DAC 122 can be used. For example, where the estimated state variables $x_n$ further include higher-order derivatives of the phase of the local clock signal 118, the state transition matrix $F_n$ used by the Kalman filter 128 can include additional coefficients that are associated with the DAC 122 in order to account for the variability of the unit step $k_v$ for different values of the digital input 126 of the DAC 122 and to account for the effect on those higher-order derivatives of the phase of the local clock signal 118.

The Kalman filter 128 is used in a recursive estimation process. For each sample n, the process performs a "predict phase" in which the state variables $x_n$ are estimated for sample n using the Kalman model described above. Then, for that sample n, the process performs an "update phase" in which the packet-network based synchronization protocol is performed for sample n in order to make various "measurements" that are used to update the state variables $x_n$ for the sample n. The resulting updated state variables can then be used for adjusting the local clock 104. The local clock signal 118 output by the oscillator 116 can be adjusted appropriately to account for the updated phase error value and for the updated frequency error value in order to synchronize the local clock 104 with the master clock 106 (for example, using a conventional negative feedback control loop). Moreover, each adjustment of the local clock 104 can be done more precisely because a "better" value for the digital input 126 applied to the DAC 122 can be determined for each adjustment using the updated unit step value for sample n determined using the Kalman filter 128. The value for the digital input 126 is better in the sense that the resulting analog output signal 124 output by the DAC 122 will more precisely match the one necessary to achieve the desired adjustment of the local clock 104. As a result, the local clock 104 will be more precisely synchronized with the master clock 106.

FIGS. 1 and 2 illustrate one example of how the state estimation improvements for time synchronization described here can be implemented. It is to be understood, however, that these improvements can be implemented in other ways. For example, the system 100 can be configured to use GPS for time synchronization. In such an implementation, the system 100 includes a GPS receiver 150 (shown in FIG. 1) which receives GPS signals and provides outputs that can be used to make measurements for use with the Kalman filter 128. In such an implementation, the master clock 106 to which the local clock 104 is synchronized comprises a GPS clock.

Also, as noted above, the system 100 can be configured so that the state variables $x_n$ estimated using the Kalman filter 128 can further include higher-order derivatives of the phase of the local clock signal 118 (the frequency of the local clock signal 118 being the first derivative of the phase of the local clock signal 118). In such an implementation, the state transition matrix $F_n$ used by the Kalman filter 128 can include additional coefficients that are associated with the DAC 122 in order to account for the variability of the unit step $k_v$ for different values of the digital input 126 of the DAC 122 and to account for the effect on those higher-order derivatives of the phase of the local clock signal 118.

Figure 3:
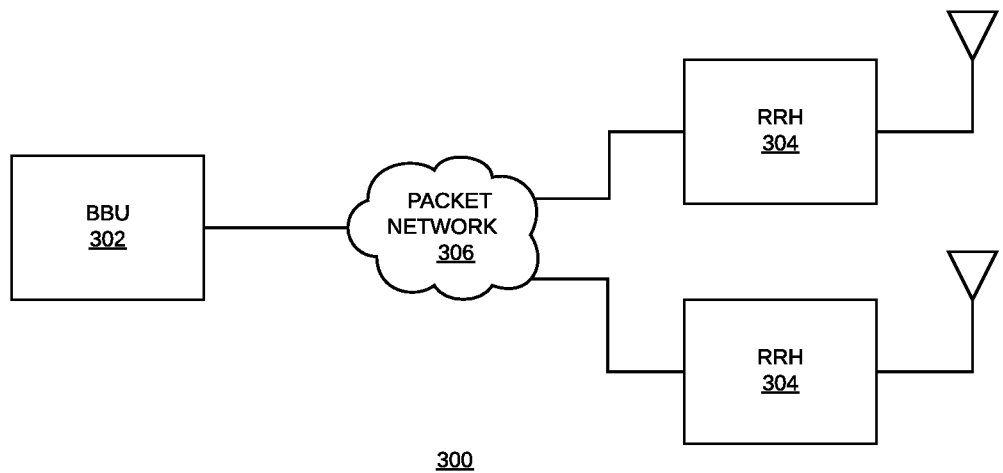
FIG. 3 is one example of a RAN in which the synchronization techniques described here can be used.

The techniques described here are well suited for use in applications that require high-precision synchronization. One example of such an application is synchronizing one or more nodes of a radio access network (RAN) used for wirelessly communicating with user equipment using licensed and/or unlicensed radio frequency spectrum. One example of such an application is shown in FIG. 3. In the example shown in FIG. 3, a radio access network (RAN) 300 includes at least one baseband unit (BBU) 302 that is communicatively coupled to one or more remote radio heads (RRH) 304 over a packet-based network 306 (for example, an Ethernet network). In this example, one or more of the BBU 302 and the RRH 304 use a packet-network based synchronization protocol such as the NTP or the PTP to synchronize their local clocks to a master clock. The master clock can be another node of the RAN (for example, where the master clock is associated with the BBU 302 and one or more of the RRHs 304 synchronize their local clocks to the master clock of the BBU 302) or can be a separate node (for example, where a separate timing master node 308 is used and both the BBU 302 and the RRHs 304 synchronize their local clocks to the master clock of the timing master node 308). The techniques described above can be used by such nodes to synchronize their local clocks to the master clock.

Figure 4:
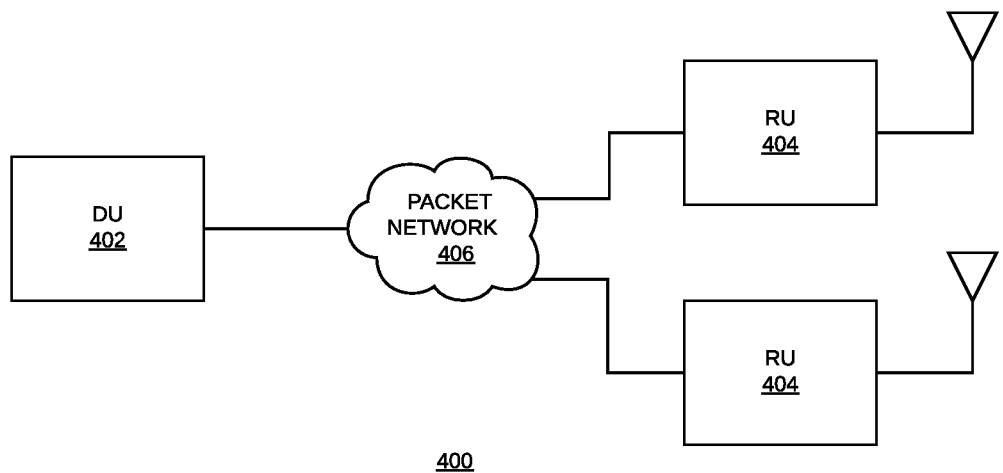
FIG. 4 is another example of a RAN in which the synchronization techniques described here can be used.

Another example of a RAN in which the synchronization techniques described above can be used is shown in FIG. 4. In the example shown in FIG. 4, a radio access network (RAN) 400 is implemented using a RAN architecture and/or RAN interfaces defined by the O-RAN Alliance. ("O-RAN" is an acronym for "Open RAN".) In such an O-RAN example, a O-RAN distributed unit (DU) 402 is communicatively coupled to one or more O-RAN remote units (RUs) 404 over a packet-based network 406 (for example, an Ethernet network). In this example, one or more of the DU 402 and the DUs 404 use a packet-network based synchronization protocol such as the PTP to synchronize their local clocks to a master clock. The master clock can be another node of the RAN (for example, where the master clock is associated with the DU 402 and one or more of the RUs 404 synchronize their local clocks to the master clock of the DU 402) or can be a separate node (for example, where a separate timing master node 408 is used and both the DU 402 and the RUs 404 synchronize their local clocks to the master clock of the timing master node 408). The techniques described above can be used by such nodes to synchronize their local clocks to the master clock.

The techniques described above can be used in other applications.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

Example Embodiments

Example 1 a system comprising: a local clock configured to output a local clock signal as a function of an analog control input, the local clock signal having a frequency; and a digital-to-analog converter (DAC) configured to output an analog output signal as a function of a digital input, wherein the analog control input used by the local clock is a function of the analog output signal output by the DAC; wherein the system has a unit step that is indicative of an amount by which the frequency of the local clock signal changes in response to a change in the digital input of the DAC; wherein the system is configured to synchronize the local clock to a master clock using a Kalman filter to determine state variables using a state transition matrix that includes at least one coefficient that is associated with the DAC, wherein the state variables include a unit step variable indicative of the unit step; and wherein the system is used to control the local clock based on the state variables determined using the Kalman filter.

Example 2 includes the system of Example 1, wherein the local clock signal has a phase; and wherein the system is configured so that the state variables further include higher-order derivatives of a phase of the local clock signal.

Example 3 includes the system of any of Examples 1-2, wherein the local clock signal has a phase; and wherein the system is configured so that the state variables include a frequency variable indicative of the frequency of the local clock, a phase variable indicative of the phase of the local clock, and the unit step variable indicative of the unit step.

Example 4 includes the system of Example 3, wherein the master clock has a frequency and a phase; wherein the system is configured so that the frequency variable is a frequency error variable indicative of an error between the frequency of the local clock and the frequency of the master clock; and wherein the system is configured so that the estimated phase variable is a phase error variable indicative of an error between the phase of the local clock and the phase of the master clock.

Example 5 includes the system of any of Examples 1-4, wherein the system is configured to use at least one of the Network Timing Protocol (NTP), the IEEE 1588 Precision Time Protocol (PTP), and the global positioning system (GPS) in order to make measurements for use with the Kalman filter.

Example 6 includes the system of any of Examples 1-5, wherein the at least one coefficient that is associated with the DAC included in the state transition matrix comprises a coefficient that is indicative of a change between the digital input of the DAC between successive samples.

Example 7 includes the system of any of Examples 1-6, wherein the system is configured to synchronize the local lock to the master clock using the Kalman filter by: estimating the state variables using a Kalman model that uses the following: $x_n = F_n x_{n-1} + w_n$; wherein $x_n$ comprises the state variables for sample n and is represented by:

$$x_n = \begin{bmatrix} \theta_{e,n} \\ f_{e,n} \\ k_{v,n} \end{bmatrix};$$

wherein $\theta_{e,n}$ comprises a phase error for the sample n; wherein $f_{e,n}$ comprises a frequency error for the sample n; wherein $k_{v,n}$ comprises the unit step for the sample n; wherein $F_n$ comprises the state transition matrix for the sample n and is represented by:

$$F_n = \begin{bmatrix} 1 & T & 0 \\ 0 & 1 & (d_n - d_{n-1}) \\ 0 & 0 & 1 \end{bmatrix};$$

wherein T comprises the time between each sample; wherein $d_n$ comprises the digital input for the DAC for the sample n; wherein $d_{n-1}$ comprises the digital input for the DAC for the sample n−1; wherein $x_{n-1}$ comprises the state variables for the sample n−1; and wherein $w_n$ comprises the process noise for the sample n.

Example 8 includes the system of any of Examples 1-7, wherein the local clock comprises an oscillator.

Example 9 includes the system of Example 8, wherein the oscillator comprises a voltage controlled crystal oscillator (VCXO).

Example 10 includes the system of any of Examples 1-9, wherein the system comprises a node of a radio access network.

Example 11 includes the system of Example 10, wherein the node comprises at least one of a baseband unit (BBU) and a remote radio head (RRH).

Example 12 includes the system of any of Examples 10-11, wherein the node comprises at least one of an Open Radio Access Network (O-RAN) central unit (CU), O-RAN distributed unit (DU), and an O-RAN remote unit (RU).

Example 13 includes the system of any of Examples 1-12, further comprising at least one programmable device that is programmed to synchronize the local lock to the master clock using the Kalman filter.

Example 14 includes the system of any of Examples 1-13, further comprising circuitry configured to synchronize the local lock to the master clock using the Kalman filter Example 15 includes a method of synchronizing a local lock to a master clock, the method comprising: outputting, by the local clock, a local clock signal as a function of an analog control input, the local clock signal having a frequency; outputting, by a digital-to-analog converter (DAC), an analog output signal as a function of a digital input, wherein the analog control input used by the local clock is a function of the analog output signal output by the DAC, wherein a unit step is indicative of an amount by which the frequency of the local clock signal changes in response to a change in the digital input of the DAC; and using a Kalman filter to determine state variables using a state transition matrix that includes at least one coefficient that is associated with the DAC, wherein the state variables include a unit step variable indicative of the unit step; and controlling the local clock based on the state variables determined using the Kalman filter.

Example 16 includes the method of Example 15, wherein the local clock has a phase; and wherein the state variables further include higher-order derivatives of the phase of the local clock signal.

Example 17 includes the method of any of Examples 15-16, wherein the local clock has a phase; and wherein the state variables include a frequency variable indicative of the frequency of the local clock, a phase variable indicative of the phase of the local clock, and the unit step variable indicative of the unit step.

Example 18 includes the method of Example 17, wherein the master clock has a frequency and a phase; wherein the frequency variable is a frequency error variable indicative of an error between the frequency of the local clock and the frequency of the master clock; and wherein the system is configured so that the estimated phase variable is a phase error variable indicative of an error between the phase of the local clock and the phase of the master clock.

Example 19 includes the method of any of Examples 15-18, wherein using the Kalman filter to the determine state variables comprises: using at least one of the Network Timing Protocol (NTP), the IEEE 1588 Precision Time Protocol (PTP), and the global positioning system (GPS) in order to make measurements for use with the Kalman filter.

Example 20 includes the method of any of Examples 15-20, wherein the at least one coefficient that is associated with the DAC included in the state transition matrix comprises a coefficient that is indicative of a change between the digital input of the DAC between successive samples.

Example 21 includes the method of any of Examples 15-20, wherein using the Kalman filter to the determine state variables comprises: estimating the state variables using a Kalman model that uses the following: $x_n = F_n x_{n-1} + w_n$; wherein $x_n$ comprises the state variables for sample n and is represented by:

$$x_n = \begin{bmatrix} \theta_{e,n} \\ f_{e,n} \\ k_{v,n} \end{bmatrix};$$

wherein $\theta_{e,n}$ comprises a phase error for the sample n; wherein $f_{e,n}$ comprises a frequency error for the sample n; wherein $k_{v,n}$ comprises the unit step for the sample n; wherein $F_n$ comprises the state transition matrix for the sample n and is represented by:

$$F_n = \begin{bmatrix} 1 & T & 0 \\ 0 & 1 & (d_n - d_{n-1}) \\ 0 & 0 & 1 \end{bmatrix};$$

wherein T comprises the time between each sample; wherein $d_n$ comprises the digital input for the DAC for the sample n; wherein $d_{n-1}$ comprises the digital input for the DAC for sample n−1; wherein $x_{n-1}$ comprises the state variables for the sample n−1; and wherein $w_n$ comprises the process noise for the sample n.

Example 22 includes the method of any of Examples 15-21, wherein the local clock comprises an oscillator.

Example 23 includes the method of Example 22, wherein the oscillator comprises a voltage controlled crystal oscillator (VCXO).

What is claimed is:

1. A system comprising:
   a local clock configured to output a local clock signal as a function of an analog control input, the local clock signal having a frequency; and
   a digital-to-analog converter (DAC) configured to output an analog output signal as a function of a digital input, wherein the analog control input used by the local clock is a function of the analog output signal output by the DAC;
   wherein the system has a unit step that is indicative of an amount by which the frequency of the local clock signal changes in response to a change in the digital input of the DAC;
   wherein the system is configured to synchronize the local clock to a master clock using a Kalman filter to determine state variables using a state transition matrix that includes at least one coefficient that is associated with the DAC, wherein the state variables include a unit step variable indicative of the unit step; and
   wherein the system is used to control the local clock based on the state variables determined using the Kalman filter.

2. The system of claim 1, wherein the local clock signal has a phase; and
   wherein the system is configured so that the state variables further include higher-order derivatives of a phase of the local clock signal.

3. The system of claim 1, wherein the local clock signal has a phase; and
   wherein the system is configured so that the state variables include a frequency variable indicative of the frequency of the local clock, a phase variable indicative of the phase of the local clock, and the unit step variable indicative of the unit step.

4. The system of claim 3, wherein the master clock has a frequency and a phase;
   wherein the system is configured so that the frequency variable is a frequency error variable indicative of an error between the frequency of the local clock and the frequency of the master clock; and
   wherein the system is configured so that the estimated phase variable is a phase error variable indicative of an error between the phase of the local clock and the phase of the master clock.

5. The system of claim 1, wherein the system is configured to use at least one of the Network Timing Protocol (NTP), the IEEE 1588 Precision Time Protocol (PTP), and the global positioning system (GPS) in order to make measurements for use with the Kalman filter.

6. The system of claim 1, wherein the at least one coefficient that is associated with the DAC included in the state transition matrix comprises a coefficient that is indicative of a change between the digital input of the DAC between successive samples.

7. The system of claim 1, wherein the system is configured to synchronize the local lock to the master clock using the Kalman filter by: estimating the state variables using a Kalman model that uses the following:

$$x_n = F_n x_{n-1} + w_n;$$

wherein $x_n$ comprises the state variables for sample n and is represented by:

$$x_n = \begin{bmatrix} \theta_{e,n} \\ f_{e,n} \\ k_{v,n} \end{bmatrix};$$

wherein $\theta_{e,n}$ comprises a phase error for the sample n;
wherein $f_{e,n}$ comprises a frequency error for the sample n;
wherein $k_{v,n}$ comprises the unit step for the sample n;
wherein $F_n$ comprises the state transition matrix for the sample n and is represented by:

$$F_n = \begin{bmatrix} 1 & T & 0 \\ 0 & 1 & (d_n - d_{n-1}) \\ 0 & 0 & 1 \end{bmatrix};$$

wherein T comprises the time between each sample;
wherein $d_n$ comprises the digital input for the DAC for the sample n;
wherein $d_{n-1}$ comprises the digital input for the DAC for the sample n−1;
wherein $x_{n-1}$ comprises the state variables for the sample n−1; and
wherein $w_n$ comprises the process noise for the sample n.

8. The system of claim 1, wherein the local clock comprises an oscillator.

9. The system of claim 8, wherein the oscillator comprises a voltage controlled crystal oscillator (VCXO).

10. The system of claim 1, wherein the system comprises a node of a radio access network.

11. The system of claim 10, wherein the node comprises at least one of a baseband unit (BBU) and a remote radio head (RRH).

12. The system of claim 10, wherein the node comprises at least one of an Open Radio Access Network (O-RAN) central unit (CU), O-RAN distributed unit (DU), and an O-RAN remote unit (RU).

13. The system of claim 1, further comprising at least one programmable device that is programmed to synchronize the local lock to the master clock using the Kalman filter.

14. The system of claim 1, further comprising circuitry configured to synchronize the local lock to the master clock using the Kalman filter.

15. A method of synchronizing a local lock to a master clock, the method comprising:
   outputting, by the local clock, a local clock signal as a function of an analog control input, the local clock signal having a frequency;
   outputting, by a digital-to-analog converter (DAC), an analog output signal as a function of a digital input, wherein the analog control input used by the local clock is a function of the analog output signal output by the DAC, wherein a unit step is indicative of an amount by which the frequency of the local clock signal changes in response to a change in the digital input of the DAC; and
   using a Kalman filter to determine state variables using a state transition matrix that includes at least one coefficient that is associated with the DAC, wherein the state variables include a unit step variable indicative of the unit step; and
   controlling the local clock based on the state variables determined using the Kalman filter.

16. The method of claim 15, wherein the local clock has a phase; and
   wherein the state variables further include higher-order derivatives of the phase of the local clock signal.

17. The method of claim 15, wherein the local clock has a phase; and
   wherein the state variables include a frequency variable indicative of the frequency of the local clock, a phase variable indicative of the phase of the local clock, and the unit step variable indicative of the unit step.

18. The method of claim 17, wherein the master clock has a frequency and a phase;
   wherein the frequency variable is a frequency error variable indicative of an error between the frequency of the local clock and the frequency of the master clock; and
   wherein the system is configured so that the estimated phase variable is a phase error variable indicative of an error between the phase of the local clock and the phase of the master clock.

19. The method of claim 15, wherein using the Kalman filter to the determine state variables comprises:
   using at least one of the Network Timing Protocol (NTP), the IEEE 1588 Precision Time Protocol (PTP), and the global positioning system (GPS) in order to make measurements for use with the Kalman filter.

20. The method of claim 15, wherein the at least one coefficient that is associated with the DAC included in the state transition matrix comprises a coefficient that is indicative of a change between the digital input of the DAC between successive samples.

21. The method of claim 15, wherein using the Kalman filter to the determine state variables comprises:

estimating the state variables using a Kalman model that uses the following:

$$x_n = F_n x_{n-1} + w_n;$$

wherein $x_n$ comprises the state variables for sample n and is represented by:

$$x_n = \begin{bmatrix} \theta_{e,n} \\ f_{e,n} \\ k_{v,n} \end{bmatrix};$$

wherein $\theta_{e,n}$ comprises a phase error for the sample n;
wherein $f_{e,n}$ comprises a frequency error for the sample n;
wherein $k_{v,n}$ comprises the unit step for the sample n;
wherein $F_n$ comprises the state transition matrix for the sample n and is represented by:

$$F_n = \begin{bmatrix} 1 & T & 0 \\ 0 & 1 & (d_n - d_{n-1}) \\ 0 & 0 & 1 \end{bmatrix};$$

wherein T comprises the time between each sample;
wherein $d_n$ comprises the digital input for the DAC for the sample n;
wherein $d_{n-1}$ comprises the digital input for the DAC for the sample n−1;
wherein $x_{n-1}$ comprises the state variables for the sample n−1; and
wherein $w_n$ comprises the process noise for the sample n.

22. The method of claim 15, wherein the local clock comprises an oscillator.

23. The method of claim 22, wherein the oscillator comprises a voltage controlled crystal oscillator (VCXO).

* * * * *